(12) United States Patent
Smith et al.

(10) Patent No.: US 8,120,137 B2
(45) Date of Patent: Feb. 21, 2012

(54) ISOLATION TRENCH STRUCTURE

(75) Inventors: Michael A. Smith, Boise, ID (US); Xiaolong Fang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 601 days.

(21) Appl. No.: 12/117,391

(22) Filed: May 8, 2008

(65) Prior Publication Data
US 2009/0278227 A1 Nov. 12, 2009

(51) Int. Cl.
*H01L 21/76* (2006.01)
(52) U.S. Cl. ............. 257/506; 257/510; 257/E21.549; 438/424; 438/696
(58) Field of Classification Search .......... 257/506, 257/510, E21.548, E21.549; 438/424, 427, 438/221, 695, 696
See application file for complete search history.

(56) References Cited

U.S. PATENT DOCUMENTS

| | | | |
|---|---|---|---|
| 5,275,965 A | 1/1994 | Manning | |
| 6,175,147 B1 | 1/2001 | Akram | |
| 6,437,417 B1 | 8/2002 | Gilton | |
| 6,583,060 B2 | 6/2003 | Trivedi | |
| 6,719,012 B2 | 4/2004 | Doan et al. | |
| 6,720,217 B2 | 4/2004 | Kim et al. | |
| 6,830,977 B1 | 12/2004 | Jono et al. | |
| 6,849,919 B2 * | 2/2005 | Sumino et al. | 257/510 |
| 6,894,354 B2 | 5/2005 | Jono et al. | |
| 6,982,207 B2 | 1/2006 | Bai et al. | |
| 6,995,095 B2 | 2/2006 | Yu | |
| 7,078,286 B1 | 7/2006 | Mehta | |
| 7,611,962 B2 | 11/2009 | Kwak | |
| 7,989,309 B2 * | 8/2011 | Ang | 438/427 |
| 2002/0033516 A1 | 3/2002 | Choi et al. | |
| 2002/0039843 A1 | 4/2002 | Ikeda et al. | |
| 2002/0056886 A1 * | 5/2002 | Usui et al. | 257/506 |
| 2002/0059886 A1 | 5/2002 | Usui et al. | |
| 2004/0002221 A1 | 1/2004 | O'Donnell et al. | |
| 2004/0014281 A1 | 1/2004 | Kim et al. | |
| 2004/0023508 A1 | 2/2004 | Chinn et al. | |
| 2004/0266136 A1 * | 12/2004 | Jung et al. | 438/437 |
| 2005/0079722 A1 | 4/2005 | Yu | |
| 2005/0279998 A1 * | 12/2005 | Cole et al. | 257/59 |
| 2006/0220171 A1 | 10/2006 | Choi et al. | |
| 2006/0258098 A1 | 11/2006 | Lee | |
| 2007/0194402 A1 | 8/2007 | Sandhu et al. | |
| 2007/0246795 A1 | 10/2007 | Fang et al. | |
| 2009/0026586 A1 | 1/2009 | Anderson | |
| 2009/0176330 A1 | 7/2009 | Wilson et al. | |
| 2010/0062850 A1 | 3/2010 | Fang et al. | |

FOREIGN PATENT DOCUMENTS

JP 2005294759 A 10/2005

* cited by examiner

*Primary Examiner* — Victor A Mandala
*Assistant Examiner* — Scott Stowe
(74) *Attorney, Agent, or Firm* — Brooks, Cameron & Huebsch, PLLC

(57) ABSTRACT

Among structures, methods, devices, and systems for isolation trenches, a semiconductor device is provided that includes a substrate and an isolation trench structure. One such isolation trench structure includes a first isolation trench portion associated with a surface of the substrate and having a first pair of opposing sidewalls that are each substantially perpendicular to the surface of the substrate. A second isolation trench portion includes a second pair of sidewalls within the substrate that are each angled obliquely with respect to the surface of the substrate, where the second isolation trench portion has a separation between the second pair of sidewalls that decreases as a distance from the first isolation trench portion increases. A third isolation trench portion includes a third pair of sidewalls within the substrate that are each substantially perpendicular to the surface of the substrate.

30 Claims, 8 Drawing Sheets

ISOLATION TRENCH STRUCTURE

RELATED APPLICATION

The present application is related to U.S. patent application Ser. No. 11/358,267, filed Feb. 21, 2006, entitled "Shallow Trench Isolation Structure".

TECHNICAL FIELD

The present invention relates to the field of semiconductor integrated circuits and, in particular, to an improved structure and method for making trenches for isolation.

BACKGROUND OF THE INVENTION

In modern semiconductor device applications, numerous devices are packed onto a single small area of a semiconductor substrate to create an integrated circuit. For the circuit to function, many of these individual devices may need to be electrically isolated from one another. Accordingly, electrical isolation is an important and integral part of semiconductor device design for preventing the unwanted electrical coupling between adjacent components and devices.

As the size of integrated circuits is reduced, the devices that make up the circuits must be positioned closer together in order to comply with the limited space available on a typical semiconductor substrate. As the industry strives towards a greater density of active components per unit area of semiconductor substrate, effective isolation between circuits becomes all the more important.

Isolating circuit components in modern integrated circuit technology may take the form of trench isolation structures etched into a semiconductor substrate. Once the trench isolation structures are etched in the semiconductor substrate, a dielectric material may be deposited to fill the trenches. As the density of components on the semiconductor substrate increased, the widths of the trenches sometimes decreased until the process of flowing dielectric material into the trenches developed problems.

Constrictions may develop due to a narrow opening at the top of the trench, which may be exacerbated by depth of the trench, as the dielectric material flows to an edge between a substrate surface and a sidewall of the trench. As the dielectric material flows into the trench, the constrictions may develop into voids moving into the trench with the dielectric material, which may, for instance, become filled or contaminated with conductive materials that lower the dielectric characteristics of the dielectric material used and/or introduce structural instabilities in subsequent processes.

A way to isolate high-voltage (HV) regions in, for instance, periphery devices (e.g., NAND Flash devices) is to increase the depth of trenches around the periphery of one or more arrays of memory cells. However, attempts to reduce introduction of voids into the dielectric material filling a trench isolation structure, in combination with shrinking size and spacing of the arrays, may limit the effective depth achievable in, for instance, the peripheral isolation trench structure. Limitations on the effective depth of the isolation trench structure may, in some instances, limit a voltage differential that can be isolated in a HV region without coupling and/or drainage to an adjacent region.

DETAILED DESCRIPTION OF THE INVENTION

Figure 1:
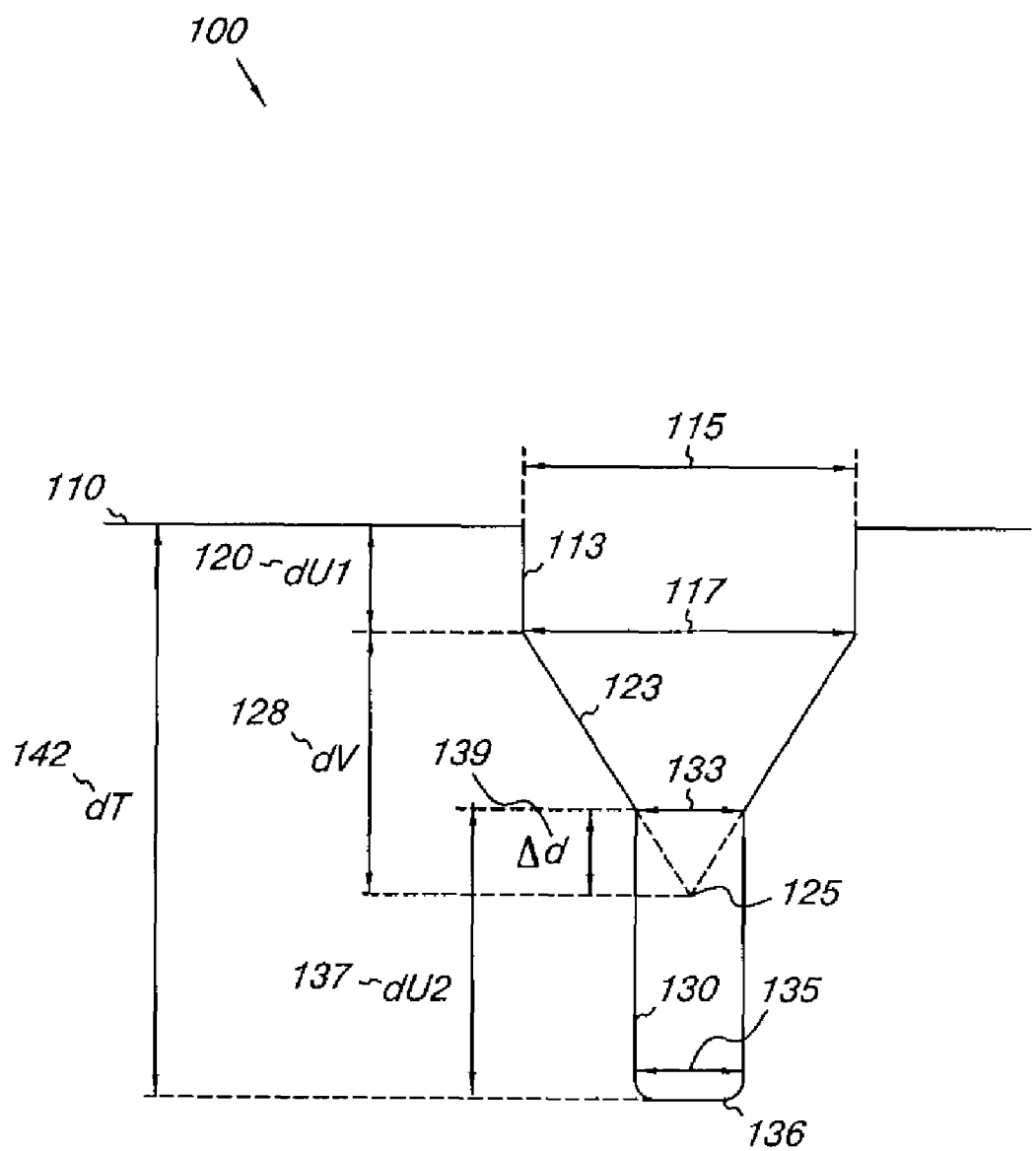
FIG. 1 illustrates a schematic cross sectional view of an embodiment of an isolation trench structure according to embodiments of the present disclosure.

Among structures, methods, devices, and systems for isolation trenches, a semiconductor device is provided that includes a substrate and an isolation trench structure. One such isolation trench structure includes a first isolation trench portion associated with a surface of the substrate and having a first pair of opposing sidewalls that are each substantially perpendicular to the surface of the substrate. A second isolation trench portion includes a second pair of sidewalls within the substrate that are each angled obliquely with respect to the surface of the substrate, where the second isolation trench portion has a separation between the second pair of sidewalls that decreases as a distance from the first isolation trench portion increases. A third isolation trench portion includes a third pair of sidewalls within the substrate that are each substantially perpendicular to the surface of the substrate.

The present disclosure provides an improved isolation trench structure. Although isolation trench structures have been used extensively to isolate circuit components and/or HV active areas (e.g., in an array of memory cells), dielectric deposition and trench fill has sometimes proven difficult due to the development of voids and/or keyholes. Dielectric material may be deposited in trenches using chemical vapor deposition (CVD) or high-density plasma chemical vapor deposition (HDP-CVD). However, during such deposition, dielectric material may collect on the walls and/or corners of the trenches such that overhangs of dielectric material may result. Such overhangs may, for instance, increase in size and fuse before the trench is filled, and a void in the dielectric material filling the width (e.g., between the sidewalls) may be created. A number of techniques have been utilized in attempts to reduce the incidence of voids and/or keyholes resulting from trench fill problems.

The related application entitled "Shallow Trench Isolation Structure" (U.S. patent application Ser. No. 11/358,267, filed Feb. 21, 2006) provides a detailed disclosure of an isolation trench structure, along with a method for forming such an isolation trench structure, with a first isolation trench portion and a second isolation trench portion that has an angled surface, where the volume of the first isolation trench portion can be greater than the second isolation trench portion. Because the volume of the second isolation trench portion is smaller than the first isolation trench portion and/or the sidewalls of the second isolation trench portion approach each other in a V configuration, the trench bottom can fill faster than would likely occur in a uniform, rectangular isolation trench structure in a U configuration. As the second isolation trench portion V configuration fills, the dielectric material can reach the first isolation trench portion and the surface of the semiconductor substrate more quickly than in a uniform U configuration. The U+V configuration can thereby reduce the incidence of voids and/or keyholes resulting from formation of overhangs of dielectric material that may otherwise have been beginning to form.

Advancements in various fields of electronic device technology include HV periphery devices (e.g., NAND Flash devices, among others) that shrink in size, along with closer spacing of electronic components. The proximity of regions having high voltage relative to regions having comparatively low voltage may become smaller and smaller. By way of example and not by way of limitation, a NAND Flash device can have low voltage logic arrays (e.g., with cmos memory cells) with 1.8-3.8 Volt potentials adjacent HV regions (e.g., devices) having 15-29 Volt potentials, or even 31 Volts within a pump. This closely spaced voltage differential can represent a challenge in preventing coupling and/or drainage of voltage to an adjacent low voltage region from a periphery of a HV region.

Moreover, even within potentially HV regions of one or more devices, nodes of such (e.g., drain, source, etc., in transistors) may toggle between high voltage and lower voltage (e.g., zero voltage) as circuits, for example, operate. Hence, a particular node of one device, for instance, may have a high voltage potential while another node of a neighboring device may have a low voltage potential, which also can represent a challenge in preventing coupling and/or drainage of voltage to the low voltage region of one device from the high voltage region of another device.

In addition, around 20-25 Volts may be required for tunneling cell operation and generation, routing, and/or decoding of such high voltages can consume area. The rate of scaling of decoders, for instance, is slower than the rate of scaling of memory cells to a reduced size. The mating of HV decoders to shrinking memory cells can represent another challenge.

Maintaining isolation of voltage differentials in HV periphery devices may be accomplished with increased doping within the isolation trench structure and/or by constructing a deeper isolation trench structure. Increasing trench depth may be preferable because doping may have a side effect of HV drain junction breakdown. However, as discussed herein, simply etching deeper in a uniform U configuration may have the negative effect of making the isolation trench structure unfillable (e.g., by increasing incidence of voids and/or keyholes), thereby being detrimental to performance of the particular device.

The U+V configuration of the isolation trench structure can be formed with a substantially perpendicular walled U portion of an etch that is followed by an obliquely angled V walled portion of the etch. The V walled portion of the etch can be effectuated by depositing a heavy polymer (i.e., a spacer) during this portion of the etch. A result of such heavy polymer deposition can be the walls of the etch tapering from the width of the U portion to a sharp or rounded point at the bottom of the V portion of the etch. The depth at which the walls of the V portion of the etch converge (i.e., the "pinch-off") can limit the depth of the isolation trench structure by preventing etching any deeper.

As described in the present disclosure, deeper isolation trench structures can be formed by reverting to etching sidewalls that are substantially perpendicular to the surface of the substrate before the V portion of the isolation trench structure reaches the pinch-off. Such etching of the lower U portion (U2) can be continued to an unlimited depth (dU2) below the V portion and the upper U portion (U1). Forming an isolation trench structure as disclosed herein can, in various embodiments, result in a funnel-shaped profile that can be described as a U1+V+U2 configuration.

FIG. 1 illustrates a schematic cross sectional view of an embodiment of an isolation trench structure according to embodiments of the present disclosure. The isolation trench structure 100 shown in FIG. 1 illustrates a substrate surface 110 (e.g., on a substrate of a semiconductor), a first isolation trench portion 113 having a pair of sidewalls separated by a width (S) (shown at 115) that can, for example, form a width 117 between active areas near the substrate surface 110. In some embodiments, the width 115 of a separation of the sidewalls at the substrate surface 110 can be substantially the same as the width 117 between active areas near the bottom of the first isolation trench portion 113, and both can be represented as S. In addition, both S widths can be vertically aligned with respect to the substrate surface 110, such that each of the pair of sidewalls is substantially perpendicular to the substrate surface 110. The first isolation trench portion 113 can, in various embodiments, have a particular depth dU1 (shown at 120) that depends on the height of each of the pair of sidewalls.

As used herein, the terms "semiconductor substrate" and "semiconductive substrate" are intended to denote any construction having semiconductive material, which, by way of example and not by way limitation, can include bulk semiconductive materials such as a semiconductive wafer (e.g., alone or in assemblies including other materials thereon), and semiconductive material layers (e.g., alone or in assemblies including other materials). As also used herein, the term "substrate" refers to any supporting structure, which, by way of example and not by way of limitation, can include the semiconductive substrates described in the present disclosure. As further used herein, the term "layer" encompasses both the singular and the plural unless otherwise indicated.

In addition, the term "substrate", as used in the present disclosure, can, in some embodiments, include any semiconductor-based structure that has an exposed silicon surface. Such structures can include silicon-on insulator (SOI), silicon-on sapphire (SOS), doped and undoped semiconductors, and/or epitaxial layers of silicon supported by a base semiconductor foundation, among other semiconductor structures. In some substrate embodiments, the semiconductor need not be silicon-based. The semiconductor can, in various embodiments, be silicon-germanium, germanium, and/or gallium-arsenide, among other compounds. When reference is made to a substrate herein, previous unspecified process steps may have been utilized to form regions or junctions in the base semiconductor and/or foundation.

As illustrated in FIG. 1, the embodiment of the isolation trench structure 100 includes a second isolation trench portion 123 having a pair of sidewalls that extend further into the substrate below the first isolation trench portion 113. The second isolation trench portion 123 can have sidewalls that are angled obliquely with respect to the surface of the substrate 110. The second isolation trench portion 123 can have a separation between the second pair of sidewalls that decreases as a distance from the first isolation trench portion increases. That is, the second isolation trench portion 123 can have a width 117 at the top of the second isolation trench portion (e.g., which can be the same as the width at the bottom of the first isolation trench portion 113) that is larger than a width 133 closer to the bottom of the second isolation trench portion.

The converging slopes of the pair of sidewalls of the second isolation trench portion 123 can be extrapolated to a point where the pair of sidewalls would meet in a pinch-off 125 that would prevent further deepening of the isolation trench structure were it not for forming isolation trench structures as described in embodiments of the present disclosure. The second isolation trench portion 123 would, in various embodiments, have a particular depth dV (shown at 128) that depends upon an angle at which each of the pair of sidewalls is etched into the substrate below the first isolation trench portion 113.

As illustrated in FIG. 1 the embodiment of the isolation trench structure 100 includes a third isolation trench portion 130 having a pair of sidewalls that extend further into the substrate below the second isolation trench portion 123. The isolation trench structure 100 includes a third isolation trench portion 130 having a pair of sidewalls separated by a width 133 that forms a width between active areas near an intersection with the second isolation trench portion 123.

In some embodiments, the width 133 of a separation of the sidewalls near the intersection with the second isolation trench portion 123 can be substantially the same as the width 135 between active areas near the bottom of the third isolation trench portion 130. In addition, in various embodiments, both widths can be vertically aligned with respect to the substrate surface 110 and/or the sidewalls of the first isolation trench portion 113, such that each of the pair of sidewalls of the third isolation trench portion 130 can be substantially perpendicular to the substrate surface 110 and/or parallel with the sidewalls of the first isolation trench portion 113. As appreciated by one of ordinary skill in the relevant art, dry etching, as described herein, can result in a rounded U-shaped configuration at the bottom of a trench with parallel walls, as illustrated at a bottom 136 of the third isolation trench portion 130, which can also represent the bottom of the U1+V+U2 configuration.

The third isolation trench portion 130 can, in various embodiments, have a particular depth dU2 (shown at 137) that depends on the height of each of the pair of sidewalls in the third isolation trench portion 130. The total depth dT (shown at 142) of the isolation trench structure 100 illustrated in FIG. 1 depends on combination of the particular depths of the first isolation trench portion dU1 (shown at 120), the second isolation trench portion dV (shown at 128), the third isolation trench portion dU2 (shown at 137), and, in particular, a position at which the V of the second isolation trench portion 123 is truncated by beginning to etch the third isolation trench portion 130 before a pinch-off 125 prevents etching deeper into the substrate.

As such, a broad range of potential dV values for the second isolation trench portion, resulting from variable positions in initiation of etching the third isolation trench portion relative to the potential pinch-off point in combination with variable etch angles, as described herein, can contribute to a broad range of potential dT values for the isolation trench structure. Selection of a dT value for the isolation trench structure, as affected by the depths of the first, second, and third isolation trench portions, can be influenced by, for instance, a magnitude of a voltage differential to be isolated in, for instance, a memory array.

The higher that etching the third isolation trench portion 130 begins in the V of the second isolation trench portion 123, the greater the reduction of the dV of the second isolation trench portion 123 and the wider the separation between the sidewalls 133, 135 of the third isolation trench portion 130. As such, the total depth of the isolation trench structure illustrated in FIG. 1 can be calculated as $dT=dU1+dV+dU2-\Delta d$, where $\Delta d$ can represent the depth of the second isolation trench portion 123 that is removed by starting etching of the third isolation trench portion 130 before the occurrence of pinch-off (which would otherwise occur at 125).

Figure 2:
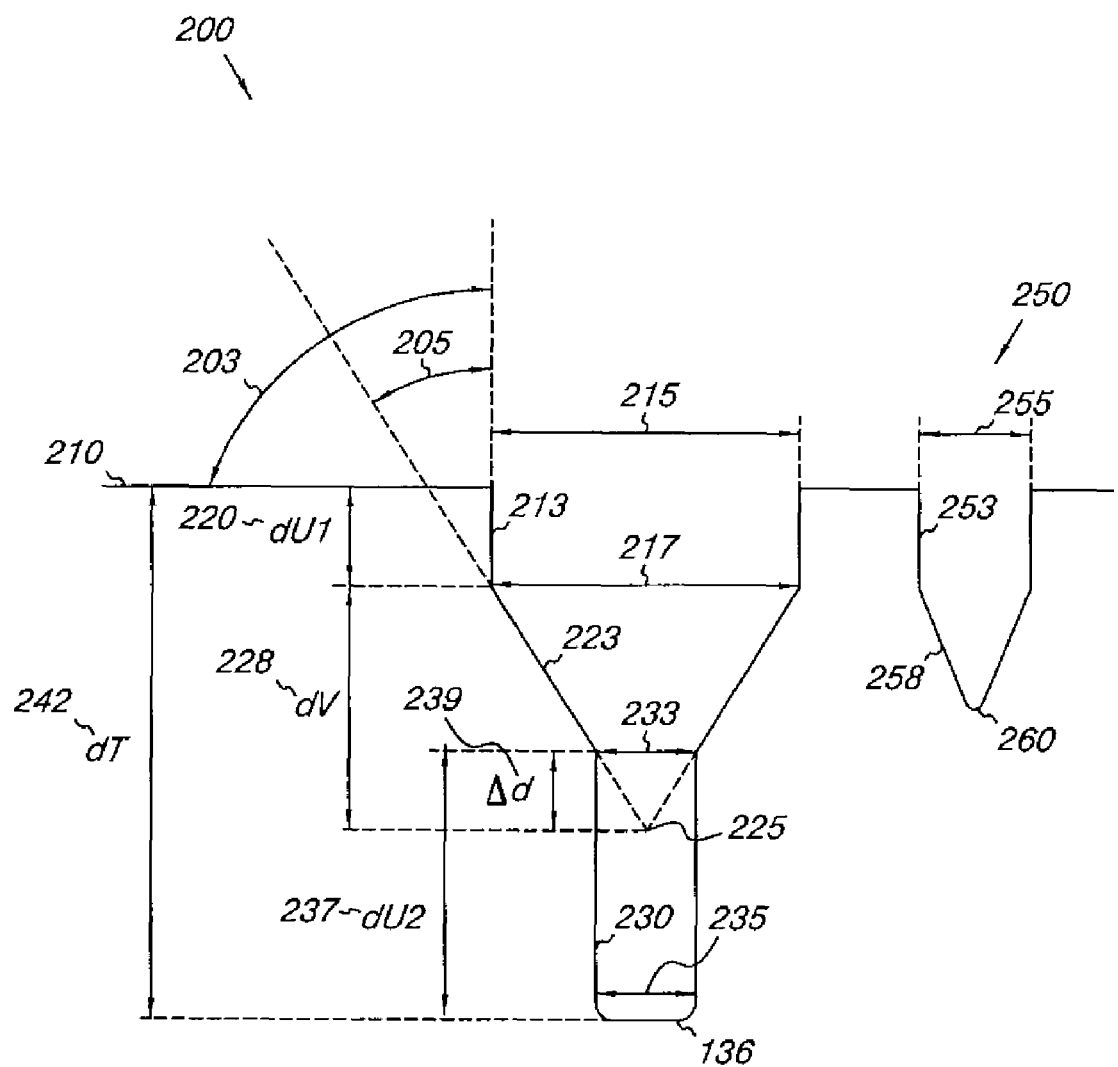
FIG. 2 illustrates a schematic cross sectional view of an embodiment of an isolation trench structure, according to embodiments of the present disclosure, in comparison to an example of a shallow trench isolation structure.

FIG. 2 illustrates a schematic cross sectional view of an embodiment of an isolation trench structure, according to embodiments of the present disclosure, in comparison to an example of a shallow trench isolation structure. The figures herein follow a numbering convention in which the first digit corresponds to the figure number and the remaining digits identify an element or component in the figure. Similar elements or components between different figures may be identified by the use of similar second and third digits. For example, 110 may reference element "10" in FIG. 1, and a similar, although not necessarily identical, element may be referenced as 210 in FIG. 2. The scaling of elements in the figures is for purposes of illustration and does not necessarily represent precise dimensions of the various elements illustrated herein.

The isolation trench structure 200 shown in FIG. 2 illustrates a substrate surface 210 (e.g., on a substrate of a semiconductor), a first isolation trench portion 213 having a pair of sidewalls separated by a width (S) (shown at 215) that forms a width 217 between active areas near the substrate surface 210. As described with regard to FIG. 1, in some embodiments, the width 215 of a separation of the sidewalls at the substrate surface 210 can be substantially the same as the width 217 between active areas near the bottom of the first isolation trench portion 213, as illustrated in FIG. 2, and both can be represented as S. In addition, both S widths can be vertically aligned with respect to the substrate surface 210, such that each of the pair of sidewalls is at a first angle 203 of approximately 90 degrees relative to the substrate surface 210. The first isolation trench portion 213 can, in various embodiments, have a particular depth dU1 (shown at 220) that depends on the height of each of the pair of sidewalls.

As illustrated in FIG. 2, the embodiment of the isolation trench structure 200 includes a second isolation trench portion 223 having a pair of sidewalls that extend further into the substrate below the first isolation trench portion 213. In various embodiments, the second isolation trench portion 223 can be contiguous with the first isolation trench portion 213 and can extend below the first isolation trench portion 213. The third isolation trench portion 230 can, in various embodiments, extend further into the substrate from a location in the second isolation trench portion 223 that is distal to the first isolation trench portion 213.

The second isolation trench portion 223 can have sidewalls that are angled obliquely at a second angle 205 with respect to the approximately 90 degree first angle 203. The second angle 203 can be used to derive a depth dV (shown at 228) of a potential pinch-off point 225 where a total depth of an isolation trench structure would be limited in the absence of embodiments of the present disclosure. The possible depth dV (shown at 228) of the pinch-off 225 of the isolation trench structure 200 can be approximated by using the S value 215, 217 between the active areas at the top of the trench (e.g., the width of the U1 portion), and the second angle (A) (shown at 205) of the etch relative to the 90 degree angle of the etch in the U1 portion above the V portion. That is, dV=S/2×tangent (A). Additionally, the potential total depth of the U1+V isolation trench structures can be approximated by adding a depth of the etch in the upper U1 portion (dU1 shown at 220) to the value determined for dV (shown at 228); that is, the potential total depth of the U1+V isolation trench structures=dU1+dV.

As described with regard to FIG. 1, the second isolation trench portion 223 illustrated in FIG. 2 has a separation between the second pair of sidewalls that decreases as a distance from the first isolation trench portion increases. That is, the second isolation trench portion 223 can have a width 217 at the top of the second isolation trench portion (e.g., which can be the same as the width at the bottom of the first isolation trench portion 213) that is larger than a width 233 closer to the bottom of the second isolation trench portion.

The second angle 205 and, for example, its reciprocal on the angle of the other sidewall of the second isolation trench portion result in converging slopes of the pair of sidewalls of the second isolation trench portion 223 that can be extrapolated to a point where the pair of sidewalls would meet in a pinch-off 225. The second isolation trench portion 223 would, in various embodiments, have a particular depth dV (shown at 228) that depends upon an angle at which each of the pair of sidewalls is etched into the substrate below the first isolation trench portion 213. That is, the smaller the second angle 205, the farther away from the top of the first isolation trench portion 213 and the top of the second isolation portion 223 a potential pinch-off point 225 would be. For example, when S is 9000 angstroms (Å), dU1 is 1000 Å, and the second angle (A) of the etch in the V portion (relative to the first 90 degree angle in the dU1 portion) is 20 degrees, the total depth of the U1+V isolation trench structures can be calculated to be 13,364 Å. By comparison, when the second angle (A) is 10 degrees (with S and dU1 remaining the same), the total depth of the U1+V isolation trench structures can be calculated to be 25,521 Å.

As illustrated in FIG. 2, the embodiment of the isolation trench structure 200 includes a third isolation trench portion 230 having a pair of sidewalls that extend further into the substrate below the second isolation trench portion 223. The isolation trench structure 200 includes a third isolation trench portion 230 having a pair of sidewalls separated by a width 233 that forms a width between active areas near an intersection with the second isolation trench portion 223.

As described with regard to FIG. 1, the third isolation trench portion 230 illustrated in FIG. 2 can, in various embodiments, have a particular depth dU2 (shown at 237) that depends on the height of each of the pair of sidewalls in the third isolation trench portion 230. The total depth dT (shown at 242) of the isolation trench structure 200 illustrated in FIG. 2 depends on combination of the particular depths of the first isolation trench portion dU1 (shown at 220), the second isolation trench portion dV (shown at 228), the third isolation trench portion dU2 (shown at 237), and, in particular, a position at which the V of the second isolation trench portion 223 is truncated by beginning to etch the third isolation trench portion 230 before a pinch-off 225 prevents etching deeper into the substrate.

The size of the second angle 205 used in etching the second isolation trench portion 223, which can be influenced by characteristics of a particular gas chemistry used in such etching and/or filling characteristics of a dielectric and/or insulating material, as described herein, used to fill the isolation trench structure 200 (e.g., propensity of a particular filling material toward creation of voids and/or keyholes).

The isolation trench structures described in the present disclosure can, in some embodiments, contain a dielectric material therein (not shown). By way of example and not by way of limitation, the dielectric material can be a high density plasma oxide (e.g., silicon dioxide, among others). In some embodiments, the isolation trench structure can further contain an insulating layer (not shown) between the dielectric material and the substrate (e.g., silicon nitride, among others).

As such, there can be a broad range of potential dV values for the second isolation trench portion, resulting from variable positions in initiation of etching the third isolation trench portion relative to the potential pinch-off point in combination with variable etch angles, which can contribute to a broad range of potential dT values for the isolation trench structure. Selection of a dT value for the isolation trench structure, as affected by the depths of the first, second, and third isolation trench portions, can be influenced by, for instance, a magnitude of a voltage differential to be isolated in, for instance, a memory array.

For example, as represented by the illustration in FIG. 2, the first pair of opposing sidewalls can be separated by a width S 215, 217 ranging from approximately two thousand (2,000) to approximately fifteen thousand (15,000) angstroms (Å). The first isolation trench portion 213 can have a depth dU1 (shown at 220) ranging from approximately four hundred (400) to approximately one thousand (1,000) Å. The second isolation trench portion 223 can have a depth ranging from approximately five hundred (500) to approximately one thousand (1,000) Å, not including the depth dΔ (shown at 239) removed by beginning to etch the third isolation trench portion 230 before etching ends at the potential pinch-off point 225. The third isolation trench portion 230 can have a depth dU2 (shown at 237) ranging from approximately three thousand (3,000) to approximately ten thousand (10,000) Å. Hence, taking into account how the depth of one portion can affect the depth of another portion of the isolation trench structure, the isolation trench structure 200 can have a total depth ranging dT (shown at 242) from approximately five thousand (5,000) to approximately fifteen thousand (15,000) Å.

As described with regard to the isolation trench structure 200 illustrated in FIG. 2, an isolation trench structure formed in a semiconductor substrate (e.g., a memory device) can, in various embodiments, include a first subset of isolation trench structures. The first subset on isolation trench structures can be formed with a first isolation trench portion having a first sidewall intersecting a surface of the semiconductor substrate at a first angle of approximately 90 degrees, and a second isolation trench portion that extends below the first isolation trench portion. The second isolation trench portion can include a second sidewall intersecting the first sidewall at a second angle that is measured with respect to a 90 degree angle to the surface and wherein the second angle is less than the first angle. The first subset of isolation trench structures can include a third isolation trench portion that extends below the second isolation trench portion. The third isolation trench portion can include a third sidewall intersecting the second sidewall at a third angle with respect to the surface that is substantially the same as the first angle of approximately 90 degrees. In some embodiments, the isolation trench structure can be formed with a second subset of isolation trench structures that can, in various embodiments, include first, second, and third isolation trench portions that substantially mirror and oppose the first subset of isolation trench structures.

In various embodiments, the second angle can range from approximately five (5) degrees to approximately forty-five (45) degrees. As such, the sidewalls of the second isolation trench portions in the first and second subsets of sidewall structures can, in various embodiments, have a separation that decreases as a distance from the first isolation trench portion increases.

The first isolation trench portion can, in various embodiments, have a first depth ranging from about five (5) percent to about fifteen (15) percent of a total trench depth of the isolation trench structure. The second isolation trench portion can, in various embodiments, have a second depth ranging from about ten (10) percent to about fifty (50) percent of a total trench depth of the isolation trench structure. Further, the third isolation trench portion can, in various embodiments, have a third depth ranging from about forty (40) percent to about eighty (80) percent of a total trench depth of the isolation trench structure.

Combination of the first, second, and third depth percentages yields approximately 100 percent. Hence, a broad range of potential depth percentages for the second isolation trench portion, at least partially resulting from varying etch angles, as described herein, can also yield a broad range of potential depth percentages for the third isolation trench portion. Actual depths of the isolation trench structure portions contributing to a total depth, as described herein, can be selected depending upon, for instance, a magnitude of a voltage differential to be isolated in, for instance, a memory array.

In various embodiments, an isolation trench structure as described in the present disclosure can be formed in a memory integrated circuit and/or around a plurality of devices contributing to formation of an electronic apparatus, among other implementations. The isolation trench structure can, in some embodiments, be formed at least partially around a periphery of a high voltage region in an array of memory cells to reduce coupling and/or drainage of voltage to an adjacent region. In some embodiments, the isolation trench structure can be formed between neighboring devices each having potentially high voltage and low voltage potentials in regions and/or nodes in order to reduce coupling and/or drainage of voltage between the neighboring devices.

By way of example and not by way of limitation, FIG. 2 illustrates a representation of a U1+V+U2 isolation trench structure 200, as described in the present disclosure, in the vicinity of a U+V shallow trench isolation (STI) structure 250, as described in the related application entitled "Shallow Trench Isolation Structure" (U.S. patent application Ser. No. 11/358,267, filed Feb. 21, 2006). By way of example and not by way of limitation, a NAND Flash device can have low voltage logic arrays (e.g., with cmos memory cells) with 1.8-3.8 Volt potentials adjacent HV regions and/or devices having 15-31 Volt potentials.

STI structures (e.g., as shown at 250) with a U+V configuration may, in some implementations, be used within a low voltage logic array to maintain voltage isolation between memory cells having relatively small potential differences through use of STI structures having a total depth ranging from approximately two thousand (2,000) Å to approximately two thousand five hundred (2,500) Å. In contrast, to maintain isolation between active areas on a semiconductor substrate, such as a memory array with 1.8-3.8 Volt potentials adjacent HV regions and/or devices having 15-31 Volt potentials, an isolation trench structure having a U1+V+U2 configuration can, for example, be formed around peripheries of such regions and/or devices and have total depths ranging from approximately five thousand (5,000) to approximately fifteen thousand (15,000) Å.

For purposes of illustration, and not as a limitation on proportionality between isolation trench structures as described in the present disclosure and STIs as described in the related disclosure, FIG. 2 illustrates a STI 250 formed in a U+V configuration having a width 255 creating a width in the substrate surface 210. The STI 250 can have a first isolation trench portion 253, which may, in some embodiments, have a depth approximating the depth dU1 (shown at 220). However, the depth of the second isolation trench portion 258 of the STI 250 will typically be shallower than the potential depth dV (shown at 228) of the second isolation trench portion 223 described in the present disclosure because, among other reasons, the width 255 of the STI 250 is substantially smaller than the width 215 of the isolation trench structure 200.

In addition, the paired sidewalls of the second isolation trench portion 258 can taper to a rounded point 260 in the center of the STI 250 (e.g., corresponding to a pinch-off) that limits the total depth of the STI 250. In contrast, forming a third isolation trench portion 230 in the isolation trench structure 200 before reaching the pinch-off point 225 allows the total depth dT (shown at 242) to be essentially unlimited (e.g., depending only on an ability of a particular etch gas chemistry to etch deeper).

Forming an isolation trench structure as described in the present disclosure can be accomplished, in various embodiments, by operating an etch reactor. The etching can be performed using in situ etching by, in various embodiments, supplying a first gas chemistry to the etch reactor to etch into a semiconductor substrate to form a first isolation trench portion within the semiconductor substrate, the first isolation trench portion having a first pair of sidewalls with a first angle of approximately 90 degrees with respect to a surface of the semiconductor substrate. A second gas chemistry can be supplied to the etch reactor to form a polymer layer on the first pair of sidewalls and a bottom portion of the first isolation trench portion. As such, a spacer can be deposited onto the etched semiconductor substrate and the spacer can be used to perform the in situ etching to form the second isolation trench portion.

In situ etching can be continued by supplying a third gas chemistry to the etch reactor to etch through the polymer layer on the bottom portion of the first isolation trench portion to etch into the semiconductor substrate and to form a second isolation trench portion having a second pair of sidewalls intersecting the first pair of sidewalls at a second angle with respect to the upper surface that is less than the first angle of approximately 90 degrees. A fourth gas chemistry can be supplied to the etch reactor to etch through a bottom portion of the second isolation trench portion to etch into the semiconductor substrate and to form a third isolation trench portion having a third pair of sidewalls intersecting the second pair of sidewalls at a third angle with respect to the surface that is substantially the same as the first angle of approximately 90 degrees.

In some embodiments, supplying the first gas chemistry (e.g., to form the first isolation trench portion by dry etching) includes supplying hydrogen bromide (HBr) and chlorine ($Cl_2$) to the etch reactor. In some embodiments, a plasma etch is performed using the first gas chemistry of HBr and $Cl_2$ in a ratio of about 2:1. As one of ordinary skill in the relevant art will appreciate, a broad variety of implementations are possible using different etch gas compositions.

When the first isolation trench portion is formed, a polymer layer can, in various embodiments, be formed on the sidewalls and the bottom portion of the first isolation trench portion using a second gas chemistry. As such, in some embodiments, supplying the second gas chemistry can include supplying difluoromethane ($CH_2F_2$) and oxygen ($O_2$) to the etch reactor. In some embodiments, the ratio of $CH_2F_2$ to $O_2$ can in a ratio of about 4:1. The polymer layer can be formed by a deposition on the first isolation trench portion by a dry etch using the second gas chemistry. The polymer can serve as a spacer by confining the next etching step into a smaller area, which can form a second isolation trench portion within and extending below the first isolation trench portion.

After the polymer layer is deposited by the second gas chemistry, in some embodiments, to serve as the spacer, further in situ etching can be performed, in various embodiments, using a third gas chemistry. As such, in some embodiments, supplying the third gas chemistry can include supplying $CH_2F_2$, HBr, and $Cl_2$ to the etch reactor. To form the second isolation trench portion, a dry, anisotropic etch can, in some embodiments, be performed using the third gas chemistry of $CH_2F_2$, HBr, and $Cl_2$. The anisotropic etch can allow the process to etch through the polymer layer on the bottom portion of the first isolation trench portion while leaving the polymer layer on the sidewall (i.e., the spacer) intact. In some embodiments, the ratio of $CH_2F_2$ to HBr to $Cl_2$ can be about 1:8:1. As will be appreciated by one of ordinary skill in the relevant art, the ratio of $CH_2F_2$ to HBr to $Cl_2$ can be adjusted to enable differing second sidewall angles and/or resultant total trench depths.

In a number of isolation trench structure etch methods, a spacer is formed using an ex situ process with either chemical vapor deposition (CVD) or plasma vapor deposition (PVD). Generally, such methods may involve the use of three chambers. For instance, in a first chamber the one or more layers, as described herein, are etched and the semiconductor substrate is etched. In a second chamber, the spacer may be formed using CVD and/or PVD. In a third chamber, the spacer and the semiconductor substrate may be further etched. By contrast, as described in the present disclosure, the spacer can, in various embodiments, be formed using a dry etch, thereby reducing the need for an ex situ process, and allowing the entire etch to be performed in one chamber (i.e., in situ).

When the polymer layer on the bottom is etched through, the dry etch can continue into the semiconductive substrate to form the second isolation trench portion with a second sidewall angled obliquely with respect to the surface of the semiconductor substrate and at a smaller angle relative to the approximately 90 degree first angle of the sidewall of the first isolation trench portion. In various embodiments, the second isolation trench portion can be formed with a second angle that ranges from approximately five (5) degrees to approximately forty-five (45) degrees relative to the first angle.

Etching of the second isolation trench portion can, in various embodiments, be stopped prior to reaching a potential pinch-off point. Following etching of the first and second isolation trench portions, the one or more additional layers, as described herein, and/or the spacer may, in various embodiments, be stripped using conventional means known to those skilled in the art, thereby contributing to forming the isolation trench structure of the present disclosure, as shown in FIGS. 1 and 2.

In various embodiments, etching the third isolation trench portion (i.e., the U2 configuration) can be performed using a fourth gas chemistry. In some embodiments, supplying the fourth gas chemistry can include supplying HBr and $Cl_2$ to the etch reactor. In some embodiments, a plasma etch can be performed using the fourth gas chemistry of HBr and $Cl_2$ in a ratio of about 2:1. As one of ordinary skill in the relevant art will appreciate, a broad variety of implementations are possible using different etch gas compositions.

In some embodiments, the in situ etching can be performed using a single mask. For example, a patterned mask layer (not shown) can, in various embodiments, be formed on a semiconductor substrate. An opening in the patterned mask layer can be performed by any suitable method. For example, if patterned mask layer is made of photoresist, then opening may be formed by any standard photolithography technique.

In some embodiments, the patterned mask layer may be composed of a hard mask material (e.g., silicon nitride, silicon oxide, and/or carbon, among others). For instance, the patterned mask layer may be formed by first depositing a blanket layer of hard mask material, then forming a patterned layer of photoresist above the hard mask material, and transferring the pattern from the photoresist to the hard mask material. Suitable methods and materials for forming suitable patterned mask layers will be appreciated by one of ordinary skill in the relevant art. Further, the present disclosure is intended to cover simultaneous or sequential in situ creation of multiple isolation trench features at various locations on a substrate with or without use of a single mask.

In some embodiments of the present disclosure, a dry etch can be used to form openings in the one or more layers on top of the substrate (e.g., a mask layer and/or conductive layers, among others). In various embodiments, the one or more layers can be dry etched using a fifth gas chemistry. That is, the fifth gas chemistry can be supplied to the etch reactor to etch through one or more layers on the semiconductor substrate and expose the semiconductor substrate. In some embodiments, supplying the fifth gas chemistry can include supplying helium (He) and carbon tetrafluoride ($CF_4$) or HBr and $Cl_2$. In some embodiments, other fluorocarbon gases, such as, by way of example and not by way of limitation, carbon trifluoride ($CHF_3$), and/or difluoromethane ($CH_2F_2$), or the like, can be substituted and/or mixed with $CF_4$. As one of ordinary skill in the relevant art will appreciate, a broad variety of implementations are possible using different etch gas compositions.

In various embodiments, an isolation trench structure as described in the present disclosure can be filled with a dielectric material (e.g., a high density plasma (HDP) oxide) that has an ability to effectively fill trenches (not shown). An insulating layer (not shown) may be formed on the first, second and/or third sidewalls prior to filling the isolation trench structure with the dielectric. The insulating layer can, in some embodiments, be formed by oxidizing the trench walls. In some embodiments, the insulating layer can be formed by depositing a thin oxide layer underneath an additional layer of silicon nitride. The insulating layer can, for example, aid in smoothing out the corners in the isolation trench structure and/or reducing the amount of stress in the dielectric subsequently used to fill the trench.

Figure 3:
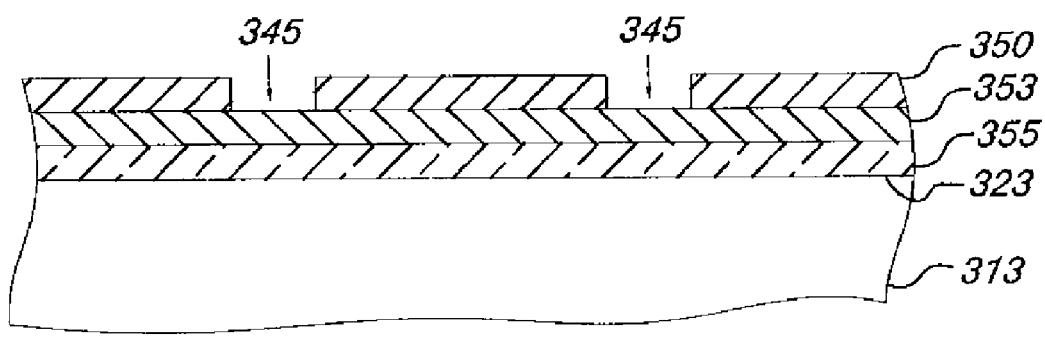
FIG. 3 illustrates a schematic cross sectional view of a representative substrate undergoing the formation of an isolation trench structure performed in accordance with embodiments of the present disclosure.

FIG. 3 illustrates a schematic cross sectional view of a representative substrate undergoing the formation of an isolation trench structure performed in accordance with embodiments of the present disclosure. FIG. 3 depicts a portion of a semiconductor substrate 313 with a patterned mask layer 350 already formed on it. An opening 345 is formed in patterned mask layer 350 by any suitable method. For example, if patterned mask layer 350 is made of photoresist, then opening 345 may be formed by any standard photolithography technique.

In some embodiments, patterned mask layer 350 is composed of a hard mask material, such as silicon nitride, silicon oxide, or carbon. In such embodiments, the patterned mask layer 350 may be formed by first depositing a blanket layer of hard mask material, then forming a patterned layer of photoresist above the hard mask material, and transferring the pattern from the photoresist to the hard mask material. Methods and materials for forming suitable patterned mask layers 350 will be apparent to those skilled in the art. Further, although only a portion of substrate 313 is depicted in FIGS. 1-8, the present disclosure contemplates simultaneous or sequential creation of multiple isolation trench features at various locations on a substrate.

FIGS. 3-6 illustrate an embodiment of various methods of forming isolation trench structures (e.g., isolation trench structure 100 in FIG. 1 and isolation trench structures 200 and 250 in FIG. 2) performed in accordance with embodiments of the present disclosure. As discussed herein, and as shown in FIG. 3, an isolation trench structure can be created by forming one or more layers on the semiconductor surface. For example, an oxide layer 355 on the semiconductor surface 323, and an additional layer 353 on the oxide layer 355 may be formed on the semiconductor substrate. However, in various embodiments, more or less layers of differing materials may also be formed, as will be appreciated by one of ordinary skill in the relevant art. In some embodiments, the additional layer 353 can be provided for conduction purposes and, in some embodiments, the additional layer 353 can be a polymer. In addition, a masking layer 350 can be formed on top of the additional layer 353. Openings 345, in various embodiments, can be formed in the masking layer 350 by means apparent to those skilled in the art.

Figure 4:
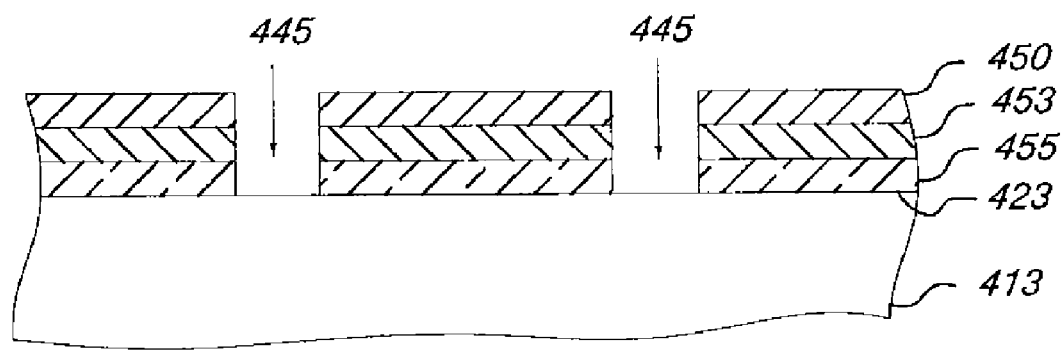
FIG. 4 illustrates a schematic cross sectional view of the representative substrate of FIG. 3 at a stage of processing subsequent to that shown in FIG. 3.

FIG. 4 illustrates a schematic cross sectional view of the representative substrate of FIG. 3 at a stage of processing subsequent to that shown in FIG. 3. FIG. 4 shows a further stage in a sequence of processing steps during the formation of an isolation trench structure performed in accordance with embodiments of the present disclosure. In various embodiments, embodiment, a dry etch technique can be used to form openings 445 in the one or more layers 450, 453, 455 to reach the surface 423 of the substrate 413. In some embodiments, the one or more layers can be dry etched using a gas chemistry of helium (He) and fluorocarbon gases, such as, by way of example, carbon tetrafluoride ($CF_4$), carbon trifluoride ($CHF_3$), and/or difluoromethane ($CH_2F_2$), or the like. A gas chemistry of hydrogen bromide (HBr) and chlorine ($Cl_2$) may also be used.

Figure 5:
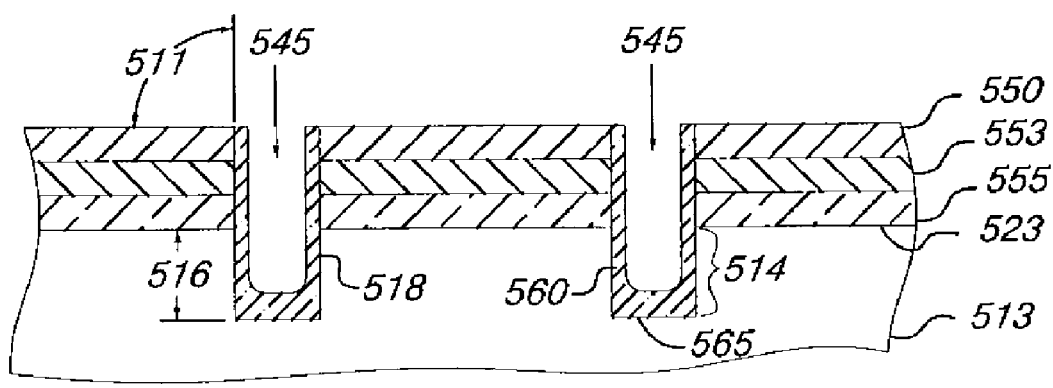
FIG. 5 illustrates a schematic cross sectional view of the representative substrate of FIG. 3 at a stage of processing subsequent to that shown in FIG. 4.

FIG. 5 illustrates a schematic cross sectional view of the representative substrate of FIG. 3 at a stage of processing subsequent to that shown in FIG. 4. FIG. 5 shows a further stage in a sequence of processing steps during the formation of an isolation trench structure 545 performed in accordance with embodiments of the present disclosure. In various embodiments, the first isolation trench portion 514 can have a first sidewall 518 that is perpendicular or nearly perpendicular to the surface of the semiconductor substrate 523 and is etched to a particular depth 516 below the surface 523 of the substrate 513 and any layers 550, 553, 555 that may be deposited above the substrate 513. That is, the first isolation portion 514 can have a first sidewall 518 that is approximately at a 90 degree angle 511 to the substrate surface 523.

In some embodiments, to form the first isolation trench portion 514, the semiconductor material can be dry etched using a gas chemistry such as HBr and $Cl_2$. For example, the plasma etch can be performed using a first gas chemistry of HBr and $Cl_2$ in a ratio of about 2:1. As one of ordinary skill in the relevant art will appreciate, a broad variety of implementations are possible using different etch gas compositions.

After the first isolation trench portion 514 is formed, in some embodiments, a polymer layer 560 can be formed on the sidewall 518 and the bottom portion 565 of the first isolation trench portion 514 using a gas chemistry such as $CH_2F_2$ and oxygen ($O_2$). For example, the polymer layer 560 can be formed using a gas chemistry of $CH_2F_2$ to $O_2$ in a ratio of about 4:1. The polymer layer 560 can be formed by a deposition on the first isolation trench portion 514 by a dry etch using this gas chemistry. The sidewall 518 polymer can serve as a spacer by confining the next etching step into a smaller area, which forms a smaller second isolation trench portion within and extending below the first isolation trench portion.

Figure 6:
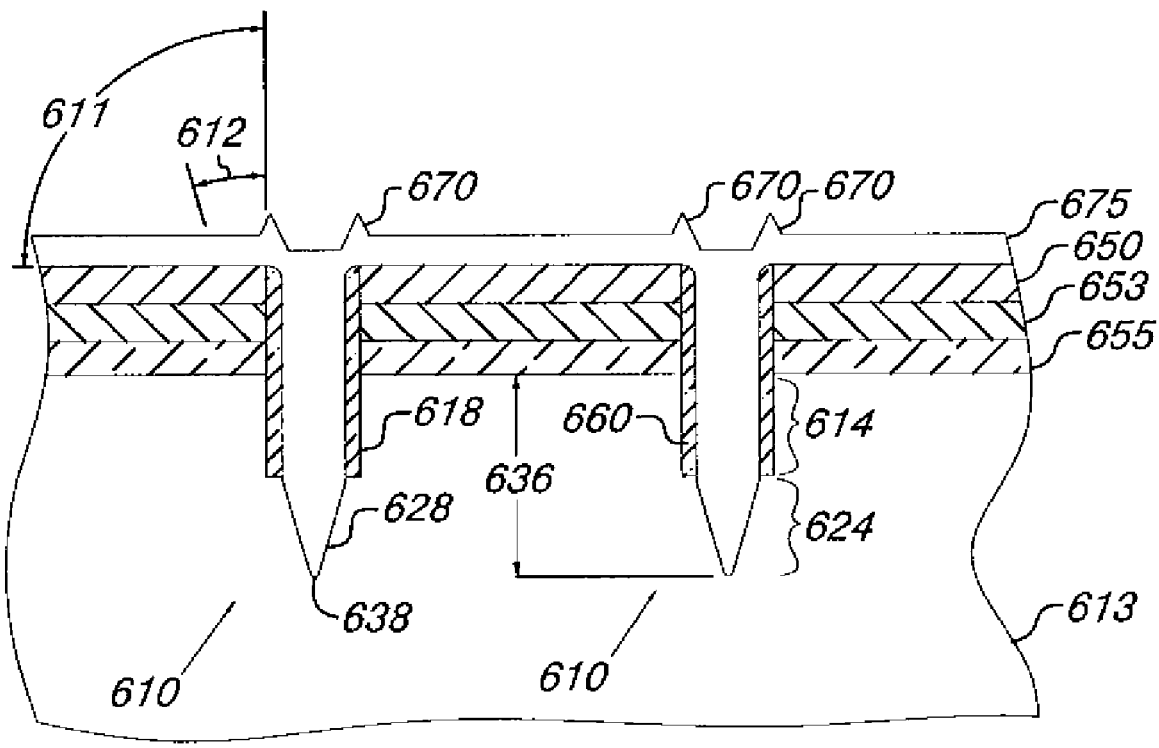
FIG. 6 illustrates a schematic cross sectional view of the representative substrate of FIG. 3 at a stage of processing subsequent to that shown in FIG. 5.

FIG. 6 illustrates a schematic cross sectional view of the representative substrate of FIG. 3 at a stage of processing subsequent to that shown in FIG. 5. FIG. 6 shows a further stage in a sequence of processing steps during the formation of an isolation trench structure performed in accordance with embodiments of the present disclosure.

Forming a second isolation trench portion 624, as illustrated in FIG. 6, can, in various embodiments, be performed using a dry, anisotropic etch. The dry, anisotropic etch can, in some embodiments, be performed using a gas chemistry such as $CH_2F_2$, HBr, and $Cl_2$. The anisotropic etch can allow the process to etch through a polymer layer 660 on the bottom portion of the first isolation trench portion 614 while leaving the polymer layer 660 on the sidewall 618 (e.g., the spacer) substantially intact.

When the polymer layer 660 on the bottom is etched through, the dry etch can continue into the semiconductive substrate 613 to form the second isolation trench portion 624 with a second sidewall 628 angled obliquely with respect to the surface of the semiconductor substrate. In some embodiments, the ratio of $CH_2F_2$ to HBr to $Cl_2$ can be about 1:8:1. As will be appreciated by one of ordinary skill in the relevant art, the ratio of $CH_2F_2$ to HBr to $Cl_2$ can be adjusted to enable differing second sidewall angles 612 in the second isolation trench portion 624 relative to the sidewall angle 611 of the first isolation trench portion 614 and differing resultant potential trench depths 636 of the U1+V portion of the total U1+V+U2 isolation trench structure.

As described in the present disclosure, a third isolation trench portion (not shown in FIG. 6) can subsequently be dry etched starting at a position in the second isolation trench portion 624 before such etching reaches a pinch-off point 638. In various embodiments, the dry etching of the third isolation trench portion (e.g., at 130 in FIGS. 1 and 230 in FIG. 2) can be performed using a gas chemistry to form sidewalls that are substantially perpendicular to the substrate surface (e.g., at approximately the same angle 611 as the first isolation trench portion 614). In some embodiments, to form the third isolation trench portion, the semiconductor material can be dry etched using a gas chemistry such as HBr and $Cl_2$. For example, a plasma etch can be performed using a gas chemistry of HBr and $Cl_2$ in a ratio of about 2:1. As one of ordinary skill in the relevant art will appreciate, a broad variety of implementations are possible using different etch gas compositions. Following etching of the first, second, and/or third isolation trench portions, the one or more additional layers and/or the spacer may be stripped using conventional means known to those skilled in the art.

An isolation trench structure as described in the present disclosure can, in some embodiments, have each of the portions thereof formed by in situ etching using a single mask. In various embodiments, the width of the lower U portion (U2) of the isolation trench structure is narrower than the width of the upper U portion (U1) and the top of the V portion of the isolation trench structure, contributing to the sequence of etches being able to be performed in situ with no more than one mask (i.e., with no masks or only one mask). Additionally, in various embodiments, an amount of polymer can be deposited in the V portion of the isolation trench structure that can serve as a mask in etching of the U2 portion of the isolation trench structure. The gas chemistry for etching the U2 portion can be selected based upon the particular polymer material deposited as the mask in the V portion such that the U2 portion can be etched to an intended depth without unintended effects on the particular polymer material deposited as the mask in the V portion.

As illustrated in FIG. 6, in some embodiments, the isolation trench structures can be filled with a dielectric material 675 (e.g., a HDP oxide). In some embodiments, the dielectric material 675 can be deposited over one or more layers 650, 653, 655 previously deposited on the substrate 613. During the trench-fill process, the dielectric material 675 may form small hills 670 around the trench openings. Chemical-mechanical polishing, as appreciated by one of ordinary skill in the relevant art, may be used to planarize the resulting structure.

An insulating layer (not shown) may, in some embodiments, be formed on the first, second, and/or third sidewalls prior to filling the isolation trench structure 610 with the dielectric material 675. In some embodiments, the insulating layer can be formed by oxidizing the trench walls. In some embodiments, the insulating layer can be formed by depositing, for example, a thin oxide layer underneath an additional layer of silicon nitride.

Figure 7:
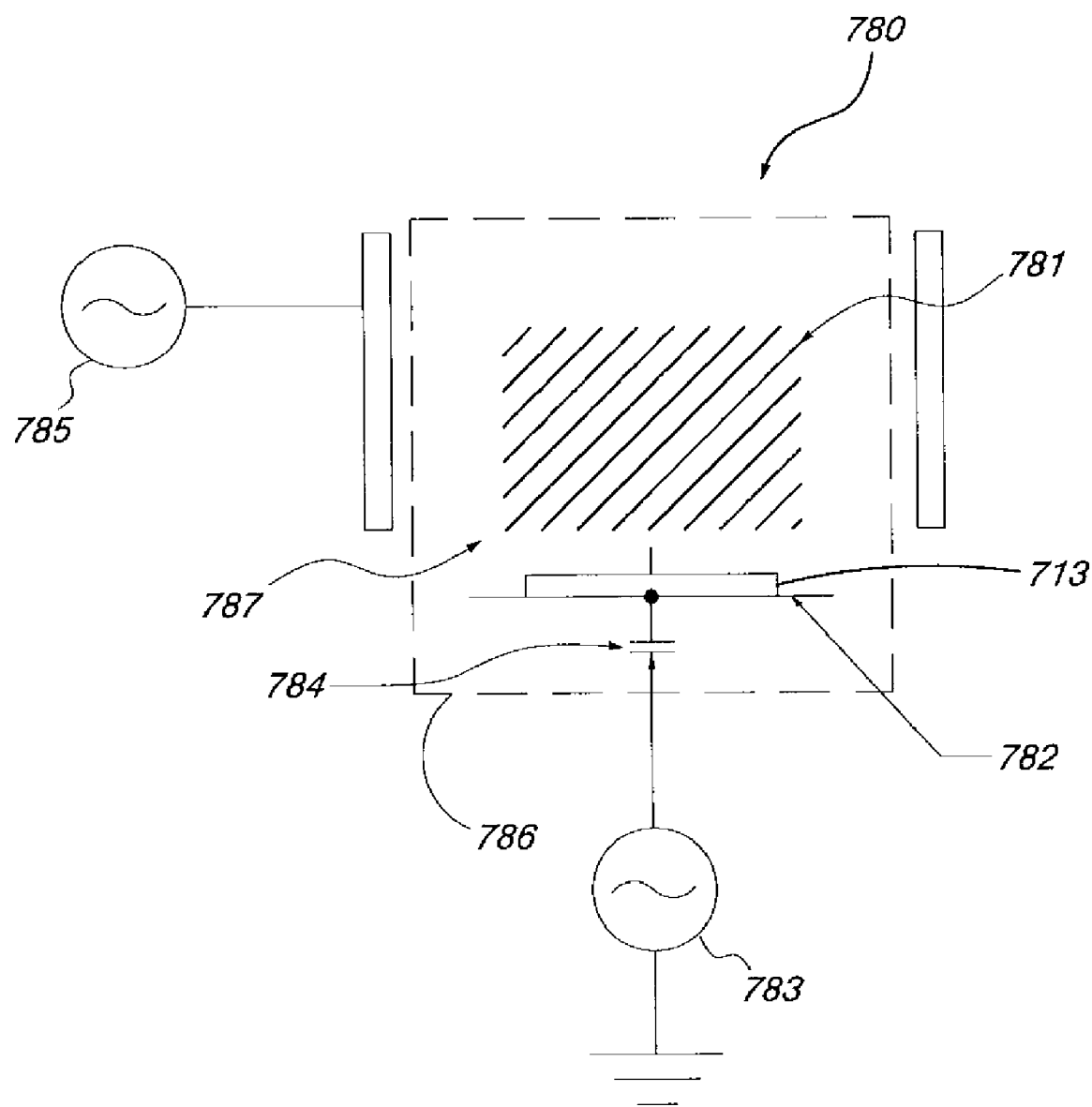
FIG. 7 illustrates a generalized diagram of a plasma generation device suitable for use with embodiments of the present disclosure.

FIG. 7 illustrates a generalized diagram of a plasma generation device suitable for use with embodiments of the present disclosure. FIG. 7 shows an illustrative etch reactor 780 for performing etching. Although only several components of the system are shown, FIG. 7 is intended as an illustrative diagram representative of an entire system for etching. Various systems incorporating elements in various configurations may be utilized. To generate plasma 781, the different gas mixtures described in the present disclosure can be provided to a plasma generator in the illustrative etch reactor 780.

The illustrative etch reactor 780 can, in some embodiments, include a powered electrode 782 connected to an RF bias source 783 via capacitance 784 upon which a semiconductor substrate 713 with one or more layers to be etched can be placed. Further, a power source 785 can be connected to elements (e.g., coils) for generating the plasma 781 in a chamber 786. An ion sheath 787 can be formed between the plasma 781 and the powered electrode 782. The power source 785 may be any suitable power source (e.g., an RF generator and/or a microwave generator, among others). It will be appreciated by one of ordinary skill in the relevant art that a number of plasma etching system implementations may be used.

With the semiconductor substrate 713 positioned within the illustrative plasma generation apparatus 780, one or more layers on the semiconductor substrate 713 can be etched using a first gas chemistry, as described herein. When the first gas chemistry is used to etch one or more layers deposited on the semiconductor substrate 713, the semiconductive substrate 713 can be then etched using a second gas chemistry, as described herein, to form the first isolation trench portion within the semiconductive material. After the first isolation trench portion is formed, a polymer layer can be formed on the first isolation trench portion sidewall and bottom by a dry etch using a gas chemistry as described herein. The polymer layer can be anisotropically etched on the bottom portion of the first isolation trench portion within the plasma etcher to expose the semiconductor substrate and further etch into the semiconductive substrate using a gas chemistry, as described herein, to create the second isolation trench portion. After stopping etching of the second isolation trench portion prior to reaching a pinch-off point, a gas chemistry, as described herein, can be used to etch a third isolation trench portion. The process described in the present disclosure can be performed in a single plasma etch chamber having the generalized configuration illustrated in FIG. 7.

Figure 8:
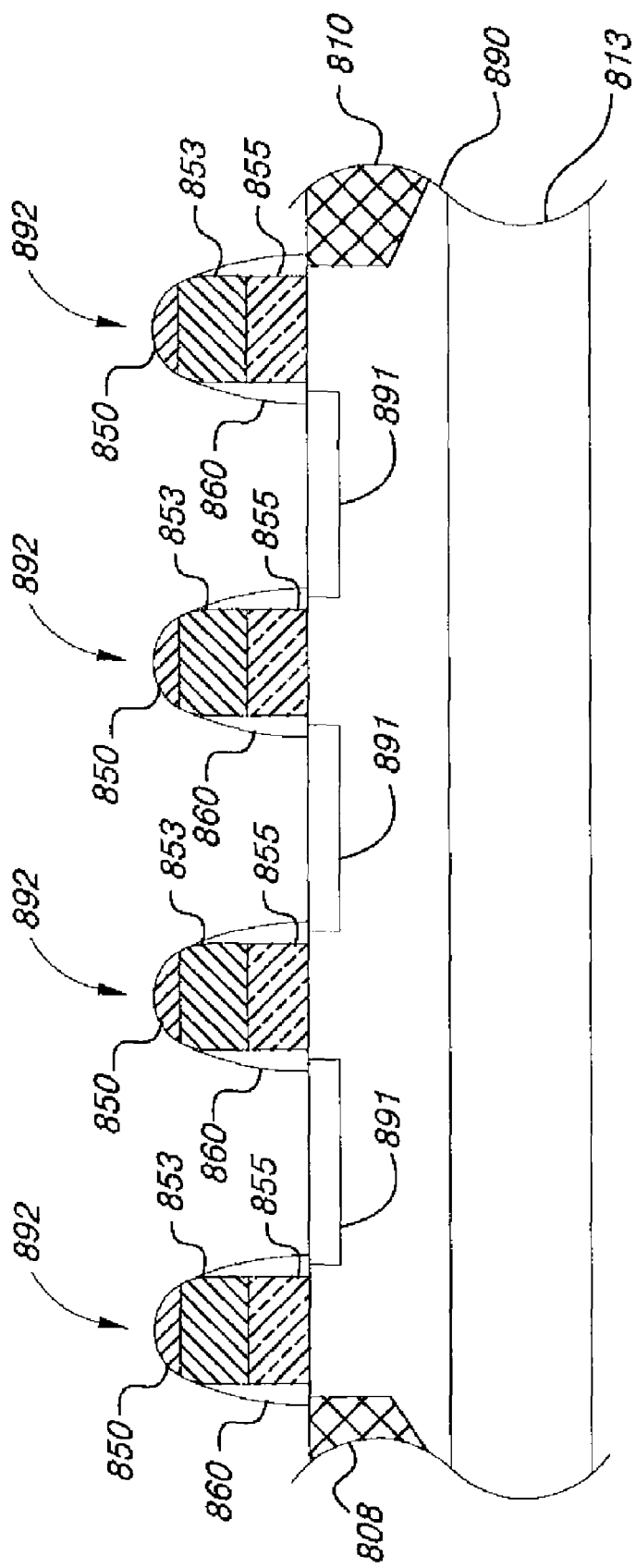
FIG. 8 illustrates a schematic cross-sectional view of a portion of a conventional memory DRAM device with a shallow trench isolation structure formed in accordance with embodiments of the present disclosure.

FIG. 8 illustrates a schematic cross-sectional view of a portion of a conventional memory DRAM device with a shallow trench isolation structure formed in accordance with embodiments of the present disclosure. In addition to the formation of trench structures for isolation, further steps to create a functional memory cell may be carried out in accordance with conventional integrated circuit fabrication processes. For example, FIG. 8 depicts a memory cell construction for a dynamic random access memory (DRAM) at an intermediate stage of the fabrication at which the cell access transistors are formed, and in which isolation trench structures 808, 810 (e.g., isolation trench structure 100 of FIG. 1 and isolation trench structure 200 of FIG. 2) has been formed in substrate 813 in accordance with embodiments of the present disclosure.

As illustrated in FIG. 8, an array of memory cells having respective access transistors can be formed within a p-well 890 of substrate 813. The transistors of the cell can, in some embodiments, be surrounded by the isolation trench structures 808, 810 to provide electrical and physical isolation. For example, N-type active regions 891 can be provided in the doped p-well 890 of substrate 813 (e.g., for NMOS transistors) and access transistors can have respective gate stacks 892, each of which can include an oxide layer 855, a conductive layer 853, spacers 860 (e.g., formed using polysilicon, and/or a nitride, among others), and/or a nitride cap 850. Polysilicon plugs, capacitors, metal contacts and/or bit lines, as appreciated by one of ordinary skill in the relevant art, can be formed in and/or on, in various embodiments, one or more insulating layers provided over the structure illustrated in FIG. 8 to produce operative DRAM cells. Memory cell arrays, such as illustrated in FIG. 8, can, in various embodiments, be at least partially surrounded (e.g., around a periphery) by isolation trench structures (e.g., as shown at 808, 810) fabricated in accordance with the present disclosure.

Figure 9:
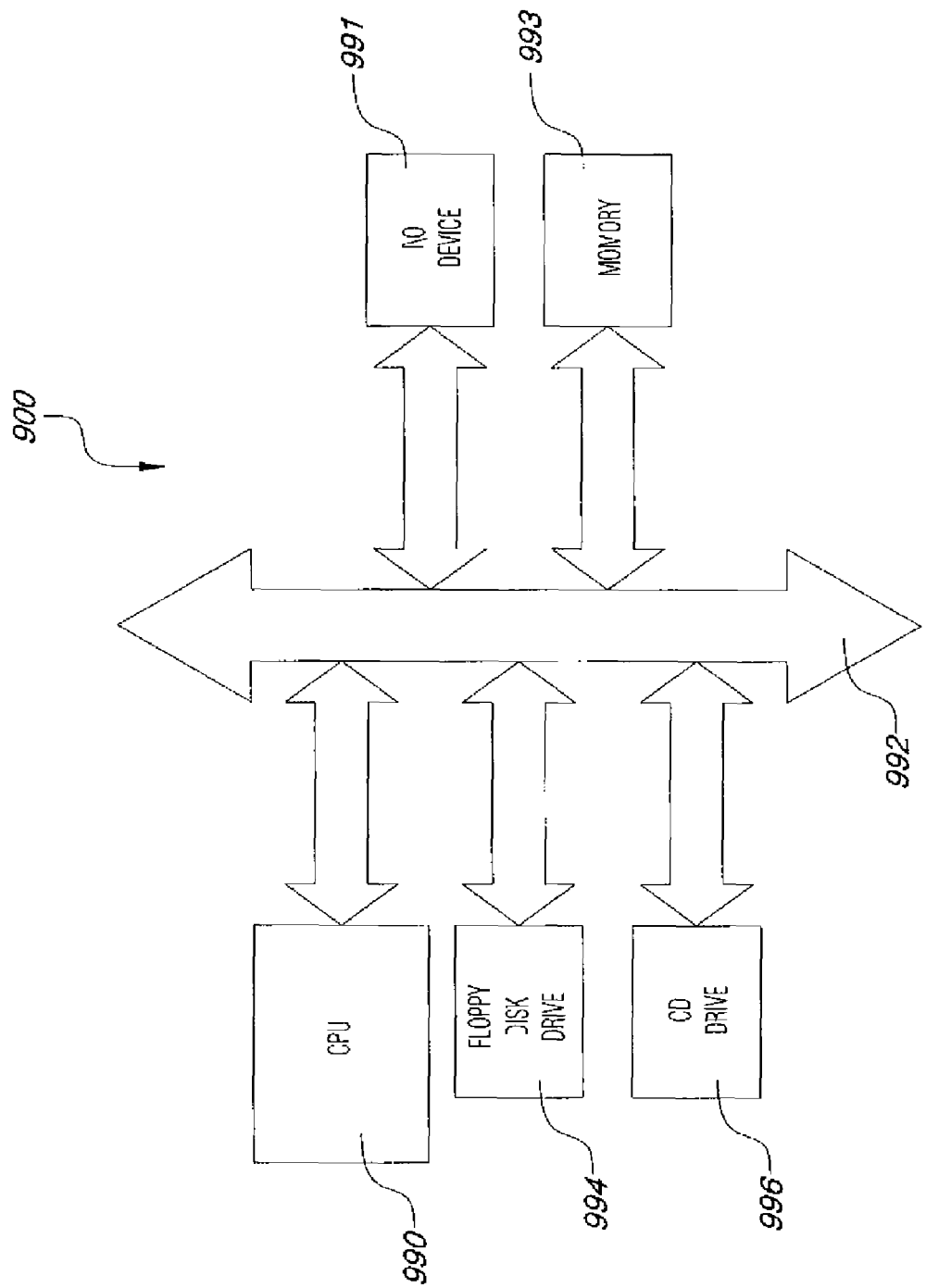
FIG. 9 illustrates a computer system having a memory cell with an isolation trench structure formed in accordance with embodiments of the present disclosure.

FIG. 9 illustrates a computer system having a memory cell with an isolation trench structure formed in accordance with embodiments of the present disclosure. Memory cell arrays can, in various embodiments, be at least partially surrounded (e.g., around a periphery) by isolation trench structures fabricated in accordance with the present disclosure as part of a processor-based system, as illustrated generally at 900 in FIG. 9. A processor-based system 900 (e.g., a computer system) can, for instance, include a central processing unit (CPU) 990 that communicates with an input/output (I/O) device 991 over a bus 992. A memory 993, including at least one isolation trench structure fabricated according to embodiments of the present disclosure, can also communicate with the CPU 990 over the bus 992. In addition, the CPU 990 may itself contain regions isolated with at least one isolation trench structure fabricated in accordance with the present disclosure.

In the case of a computer system, the processor-based system may include additional peripheral devices such as, for instance, a floppy disk drive 994, a compact disk (CD) read-only and/or read/write drive 996, and/or a digital variable disk (DVD) drive (not shown), among others, each of which may also communicate with the CPU 990 over the bus 992. Memory 993 can, for instance, be constructed as an integrated circuit that includes isolation trench structures formed as described in the present disclosure and as illustrated in FIGS. 1-8. A memory device including isolation trench structures as described in the present disclosure may be combined with a processor, such as a CPU, a digital signal processor and/or a microprocessor, with or without memory storage, in a single integrated circuit chip.

Figure 10:
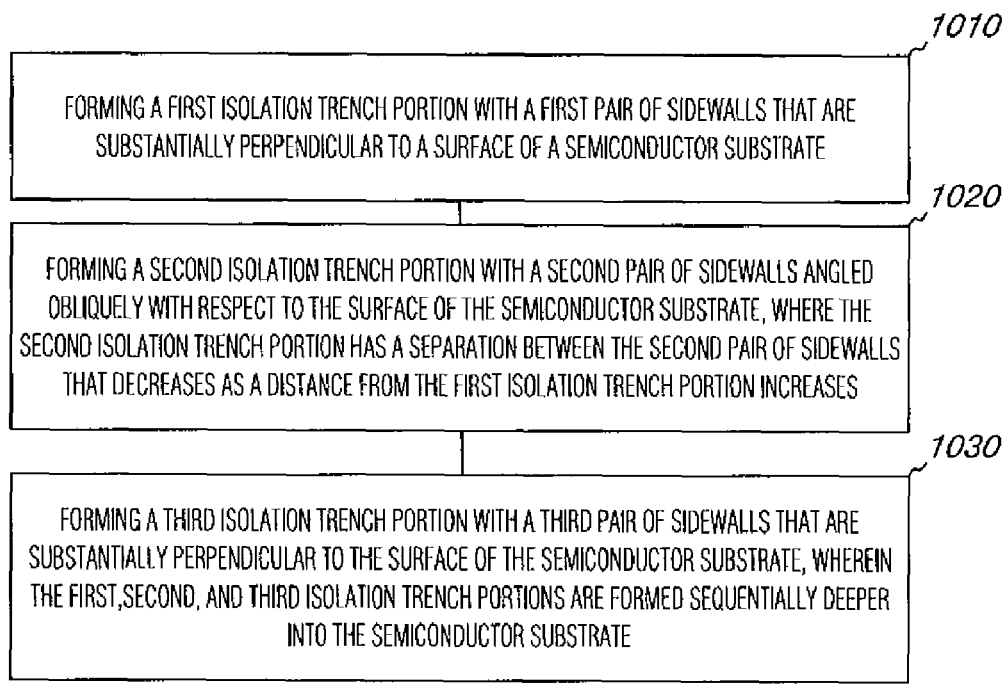
FIG. 10 is a block diagram illustrating forming an isolation trench structure in a semiconductor substrate according to method embodiments of the present disclosure.

FIG. 10 is a block diagram illustrating forming an isolation trench structure in a semiconductor substrate according to method embodiments of the present disclosure. Unless explicitly stated, the method embodiments described herein are not constrained to a particular order or sequence. Additionally, some of the described method embodiments, or elements thereof, can occur or be performed at the same, or at least substantially the same, point in time.

The embodiment illustrated in FIG. 10 includes forming a first isolation trench portion with a first pair of sidewalls that are substantially perpendicular to a surface of the semiconductor substrate, as shown at block 1010. In situ etching with a first gas mixture, in various embodiments, can etch the first isolation trench portion with sidewalls that are formed at approximately an approximate 90 degree angle relative to the surface of the semiconductor substrate. As shown in block 1020, a second isolation trench portion can be formed with a second pair of sidewalls angled obliquely with respect to the surface of the semiconductor substrate, where the second isolation trench portion has a separation between the second pair of sidewalls that decreases as a distance from the first isolation trench portion increases. As such, unless etching is stopped prior to reaching a pinch-off point, etching of the isolation trench structure will reach a terminal depth.

Block 1030 shows that a third isolation trench portion can be formed with a third pair of sidewalls that are substantially perpendicular to the surface of the semiconductor substrate, where the first, second, and third isolation trench portions are formed sequentially deeper into the semiconductor substrate. Forming a third isolation trench portion as described can prevent reaching the pinch-off point and enable formation of an isolation trench structure having a U1+V+U2 configuration that is substantially deeper than may be formed with a U+V configuration.

In some embodiments, a single mask can be used to perform in situ etching to form the isolation trench structure. That is, a single mask layer can be deposited, or multiple individual single masks can be positioned, directly upon a substrate layer or upon layers of material intervening between the single mask and the substrate layer. Hence, embodiments can include first etching through one or more layers on the semiconductor substrate and into the semiconductor substrate (e.g., to perform etching of the first isolation trench portion). Additionally, in some embodiments, a spacer can be deposited onto the etched semiconductor substrate (e.g., onto the first isolation trench portion) and the spacer can be used to perform the in situ etching to produce the second isolation trench portion.

As described in the present disclosure, an isolation trench structure can be created by forming one or more layers on the semiconductor surface. By way of example and not by way of limitation, an oxide layer may be deposited on the semiconductor surface and an additional layer on the oxide layer may also be deposited, although more or less layers of differing materials may also be deposited and/or formed, as appreciated by one of ordinary skill in the relevant art. In various embodiments, the additional layer or layers may be provided for conduction purposes and/or as a polymer. In addition, a masking layer can, in various embodiments, be formed and/or placed on top of the additional layer or layers. Openings may be formed in the masking layer and/or other layers by means appreciated by one of ordinary skill in the relevant art.

Various systems incorporating a number of elements of the present disclosure in various configurations may be utilized. By way of example and not by way of limitation, embodiments of the present disclosure can be utilized in a processor-based system that includes, among other components, a processor and a memory device coupled to the processor. The memory device can, in various embodiments, include a memory structure, where the memory structure includes an isolation trench structure having a substrate, a first isolation trench portion that forms a width between two regions on a surface of the substrate, where the first isolation trench portion includes a first pair of opposing sidewalls that are each substantially perpendicular to the surface of the substrate.

The memory device can, in various embodiments, also include a second isolation trench portion including a second pair of sidewalls within the substrate that are each angled obliquely with respect to the surface of the substrate, where the second isolation trench portion has a separation between the second pair of sidewalls that decreases as a distance from the first isolation trench portion increases. In addition, the memory device can, in various embodiments, include a third isolation trench portion including a third pair of sidewalls within the substrate that are each substantially perpendicular to the surface of the substrate.

In various embodiments, the second isolation trench portion can be contiguous with the first isolation trench portion and can extend below the first isolation trench portion. The third isolation trench portion can, in various embodiments, extend further into the substrate from a location in the second isolation trench portion that is distal to the first isolation trench portion.

In addition to the formation of trench structures for isolation, such as structure 100 of FIG. 1 and structure 200 of FIG. 2, further steps to create a functional memory device having a memory cell array may be carried out in accordance with integrated circuit fabrication processes. For example, in various embodiments, the memory device can be a dynamic random access memory (DRAM) device and/or the memory device can be a NAND flash memory device.

In some embodiments, the isolation trench structure can contain and/or be filled with a dielectric material. The isolation trench structure can, in some embodiments, further contain an insulating layer between the dielectric material and the substrate.

The improved isolation trench structure can reduce the formation of voids in the dielectric fill process, while also increasing the effective depth of the isolation trench structure. Hence, embodiments of the present disclosure can be utilized to, for example, more effectively isolate the voltage differential in a HV region and/or device in order to reduce coupling and/or drainage to an adjacent region and/or device.

An isolation trench structure formed in a semiconductor substrate (e.g., a memory device) can include a first subset of isolation trench structures. The first subset can, in various embodiments, include a first isolation trench portion having a first sidewall intersecting a surface of the semiconductor substrate at a first angle of approximately ninety (90) degrees, and a second isolation trench portion that extends below the first isolation trench portion, where the second isolation trench portion can include a second sidewall intersecting the first sidewall at a second angle that is measured with respect to a ninety degree angle to the surface and where the second angle is less than the first angle. The first subset can further include, in various embodiments, a third isolation trench portion that extends below the second isolation trench portion, where the third isolation trench portion can include a third sidewall intersecting the second sidewall at a third angle with respect to the surface that is substantially the same as the first angle of approximately 90 degrees.

In some embodiments, the isolation trench structure can be formed in a memory integrated circuit. The isolation trench structure can, in various embodiments, be formed at least partially around (e.g., a periphery of) a high voltage region in an array of memory cells to, in some instances, reduce coupling and/or drainage of voltage to an adjacent region. The isolation trench structure also can, in various embodiments, be formed at least partially around (e.g., a periphery of) a device having a high voltage potential to, in some instances, reduce coupling and/or drainage of voltage to another device having a low voltage potential.

An isolation trench structure in a semiconductor substrate can be formed according to various method embodiments of the present disclosure. In various embodiments of the method, the isolation trench structure can be formed using a first isolation trench portion with a first pair of sidewalls that are substantially perpendicular to a surface of the semiconductor substrate, and a second isolation trench portion with a second pair of sidewalls angled obliquely with respect to the surface of the semiconductor substrate, where the second isolation trench portion has a separation between the second pair of sidewalls that decreases as a distance from the first isolation trench portion increases. A third isolation trench portion can, in various embodiments, be formed with a third pair of sidewalls that are each substantially perpendicular to the surface of the semiconductor substrate, where the first, second, and third isolation trench portions are formed sequentially deeper into the semiconductor substrate.

The method can, in various embodiments, include using a single mask to perform in situ etching to produce the isolation trench structure. In some embodiments, with or without using the single mask, the method can include first etching through one or more layers on the semiconductor substrate and into the semiconductor substrate. In various embodiments, the method can include depositing a spacer onto the etched semiconductor substrate and using the spacer to perform the in situ etching to produce the second isolation trench portion, as described herein.

Although specific embodiments have been illustrated and described herein, those of ordinary skill in the relevant art will appreciate that an arrangement calculated to achieve the same results can be substituted for the specific embodiments shown. This disclosure is intended to cover all adaptations or variations of various embodiments of the present disclosure.

Reference is made to various specific embodiments in which the disclosure may be practiced herein. These embodiments are described with sufficient detail to enable those skilled in the art to practice the disclosure. It is to be understood, however, that changes may be implemented to structural, logical, and electrical components to achieve the same results and still remain within the scope of the present disclosure.

It is to be further understood that the above description has been made in an illustrative fashion, and not a restrictive one. Combination of the above embodiments, and other embodiments not specifically described herein, will be apparent to those of ordinary skill in the relevant art upon reviewing the above description.

The scope of the various embodiments of the present disclosure includes other applications in which the above structures, devices, systems, and methods are used, for example, in implementations other than computer systems. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure need to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

We claim:

1. A semiconductor device comprising:
    a substrate; and
    an isolation trench structure, comprising:
        a first isolation trench portion associated with a surface of the substrate, wherein the first isolation trench portion includes a first pair of opposing sidewalls that are each substantially perpendicular to the surface of the substrate;
        a spacer of a predetermined thickness on the sidewalls and a bottom of the first isolation trench portion that confines an in situ etch of a second isolation trench portion to a predetermined smaller area;
        the second isolation trench portion including a second pair of sidewalls within the substrate that are each angled obliquely with respect to the surface of the substrate, wherein the second isolation trench portion has a separation between the second pair of sidewalls that decreases as a distance from the first isolation trench portion increases; and
        a third isolation trench portion including a third pair of sidewalls within the substrate that are each substantially perpendicular to the surface of the substrate.

2. The semiconductor device of claim 1, wherein the second isolation trench portion is contiguous with the first isolation trench portion and extends below the first isolation trench portion.

3. The semiconductor device of claim 1, wherein the third isolation trench portion extends further into the substrate from a location in the second isolation trench portion that is distal to the first isolation trench portion.

4. The semiconductor device of claim 1, wherein the first pair of opposing sidewalls are separated by a width ranging from approximately two thousand (2,000) to approximately fifteen thousand (15,000) angstroms (Å).

5. The semiconductor device of claim 1, wherein the first isolation trench portion has a depth ranging from approximately four hundred (400) to approximately one thousand (1,000) angstroms (Å).

6. The semiconductor device of claim 1, wherein the second isolation trench portion has a depth ranging from approximately five hundred (500) to approximately one thousand (1,000) angstroms (Å).

7. The semiconductor device of claim 1, wherein the third isolation trench portion has a depth ranging from approximately three thousand (3,000) to approximately ten thousand (10,000) angstroms (Å).

8. The semiconductor device of claim 1, wherein the isolation trench structure has a total depth ranging from approximately five thousand (5,000) to approximately fifteen thousand (15,000) angstroms (Å).

9. The semiconductor device of claim 1, wherein the isolation trench structure contains a dielectric material therein.

10. The semiconductor device of claim 9, wherein the dielectric material is a high density plasma oxide.

11. The semiconductor device of claim 9, wherein the isolation trench structure further contains an insulating layer between the dielectric material and the substrate.

12. A memory device comprising:
a first subset of isolation trench structures comprising:
- a first isolation trench portion having a first sidewall intersecting a surface of a semiconductor substrate at a first angle of approximately ninety (90) degrees;
- a spacer of a predetermined thickness on the sidewalls and a bottom of the first isolation trench portion that confines an in situ etch of a second isolation trench portion to a predetermined smaller area;
- the second isolation trench portion that extends below the first isolation trench portion, wherein the second isolation trench portion includes a second sidewall intersecting the first sidewall at a second angle that is measured with respect to a ninety degree angle to the surface and wherein the second angle is less than the first angle; and
- a third isolation trench portion that extends below the second isolation trench portion, wherein the third isolation trench portion includes a third sidewall intersecting the second sidewall at a third angle with respect to the surface that is substantially the same as the first angle of approximately ninety (90) degrees.

13. The memory device of claim 12, wherein the isolation trench structure includes a second subset of isolation trench structures comprising first, second, and third isolation trench portions that substantially mirror and oppose the first subset of isolation trench structures.

14. The memory device of claim 12, wherein the second angle ranges from approximately five (5) degrees to approximately forty-five (45) degrees.

15. The memory device of claim 13, wherein the sidewalls of the first and second subsets of isolation trench structures have a separation that decreases as a distance from the first isolation trench portion increases.

16. The memory device of claim 12, wherein the first isolation trench portion further comprises a first depth ranging from about five (5) percent to about fifteen (15) percent of a total trench depth of the isolation trench structure.

17. The memory device of claim 12, wherein the second isolation trench portion further comprises a second depth ranging from about ten (10) percent to about fifty (50) percent of a total trench depth of the isolation trench structure.

18. The memory device of claim 12, wherein the third isolation trench portion further comprises a third depth ranging from about forty (40) percent to about eighty (80) percent of a total trench depth of the isolation trench structure.

19. The memory device of claim 12, wherein the isolation structure is formed at least partially around a memory array of the memory device.

20. The isolation trench structure of claim 12, wherein the isolation trench structure is formable:
- at least partially around a high voltage region in an array of memory cells; and
- at least partially around a device capable of having a high voltage potential.

21. An isolation trench structure formed according to a method comprising:
- forming a first isolation trench portion with a first pair of sidewalls that are substantially perpendicular to a surface of a semiconductor substrate;
- forming a spacer of a predetermined thickness on the etched sidewalls and a bottom of the first isolation trench portion that confines an etch of the second isolation trench portion to a predetermined smaller area;
- using the spacer to perform in situ etching to form the second isolation trench portion;
- forming the second isolation trench portion with a second pair of sidewalls angled obliquely with respect to the surface of the semiconductor substrate, wherein the second isolation trench portion has a separation between the second pair of sidewalls that decreases as a distance from the first isolation trench portion increases; and
- forming a third isolation trench portion with a third pair of sidewalls that are substantially perpendicular to the surface of the semiconductor substrate, wherein the first, second, and third isolation trench portions are formed sequentially deeper into the semiconductor substrate.

22. The structure of claim 21, wherein forming each of the portions includes in situ etching using a single mask.

23. The structure of claim 21, wherein the method includes first etching through one or more layers on the semiconductor substrate and into the semiconductor substrate.

24. The structure of claim 21, wherein the method includes etching comprising:
- supplying a first gas chemistry to an etch reactor to etch into a semiconductor substrate to form a first isolation trench portion within the semiconductor substrate, the first isolation trench portion having a first pair of sidewalls with a first angle of approximately ninety (90) degrees with respect to a surface of the semiconductor substrate;
- supplying a second gas chemistry, formed from the gas chemistry that comprises difluoromethane ($CH_2F_2$) and oxygen ($O_2$), to the etch reactor to form a polymer layer on the first pair of sidewalls and a bottom portion of the first isolation trench portion;
- supplying a third gas chemistry to the etch reactor to etch through the polymer layer on the bottom portion of the first isolation trench portion to etch into the semiconductor substrate and to form a second isolation trench portion having a second pair of sidewalls intersecting the first pair of sidewalls at a second angle with respect to the upper surface that is less than the first angle of approximately ninety (90) degrees; and
- supplying a fourth gas chemistry to the etch reactor to etch through a bottom portion of the second isolation trench portion to etch into the semiconductor substrate and to form a third isolation trench portion having a third pair of sidewalls intersecting the second pair of sidewalls at a third angle with respect to the surface that is substantially the same as the first angle of approximately ninety (90) degrees.

25. The structure of claim 24, wherein supplying the first gas chemistry comprises supplying hydrogen bromide (HBr) and chlorine ($Cl_2$).

26. The structure of claim 24, wherein supplying the third gas chemistry comprises supplying difluoromethane ($CH_2F_2$), hydrogen bromide (HBr), and chlorine ($Cl_2$).

27. The structure of claim 24, wherein supplying the fourth gas chemistry comprises supplying hydrogen bromide (HBr) and chlorine ($Cl_2$).

28. The structure of claim 24, wherein the method includes supplying a fifth gas chemistry to the etch reactor to etch through one or more layers on the semiconductor substrate and expose the semiconductor substrate.

29. The structure of claim 28, wherein supplying the fifth gas chemistry comprises supplying helium (He) and carbon tetrafluoride ($CF_4$) or hydrogen bromide (HBr) and chlorine ($Cl_2$).

30. The structure of claim 24, wherein supplying the second gas chemistry comprises supplying difluoromethane ($CH_2F_2$) and oxygen ($O_2$).

* * * * *